United States Patent [19]

Yamaguchi et al.

[11] Patent Number: 4,712,194
[45] Date of Patent: Dec. 8, 1987

[54] STATIC RANDOM ACCESS MEMORY

[75] Inventors: Seiji Yamaguchi, Hirakata; Eisuke Ichinohe, Katano; Johji Katsura, Nishinomiya, all of Japan

[73] Assignee: Matsushita Electric Industrial Co., Ltd., Kadoma, Japan

[21] Appl. No.: 739,875

[22] Filed: May 31, 1985

[30] Foreign Application Priority Data

Jun. 8, 1984 [JP] Japan .................. 59-118481
Jul. 16, 1984 [JP] Japan .................. 59-148052
Aug. 18, 1984 [JP] Japan .................. 59-171940

[51] Int. Cl.⁴ .............................. G11C 7/00
[52] U.S. Cl. .................... 365/203; 365/154; 365/189
[58] Field of Search ............ 365/203, 189, 230, 154

[56] References Cited

U.S. PATENT DOCUMENTS 3,942,162  3/1976  Buchanan .................. 365/203
4,539,661  9/1985  Oritani ..................... 365/154
4,581,718  4/1986  Oishi ....................... 365/189

OTHER PUBLICATIONS

ISSCC-Feb. 12, 1982; pp. 258-259.

Primary Examiner—James W. Moffitt
Attorney, Agent, or Firm—Wenderoth, Lind & Ponack

[57] ABSTRACT

The static random access memory reduces the access time thereof and reduces the power consumption thereof during its time of operation, and employs a circuit arrangement such that not only is the logical amplitude of each bit line diminished during a read-out operation, but the bit line is precharged after a write operation is accomplished during a write operation.

12 Claims, 3 Drawing Figures

STATIC RANDOM ACCESS MEMORY

BACKGROUND OF THE INVENTION

The present invention relates to a static random access memory (SRAM).

SRAM devices have recently tended to have larger capacities thereby raising problems with a reduction of their power consumption and a cut-back on their access time. Thus, an attempt to achieve a shorter access time tends to accompany a larger power consumption. Since an increase in the consumed current results in the evolution of heat, and a deterioration in characteristics, etc., to restrain such an increase has been taken up as a theme in the way of improvement of the reliability of the element characteristics.

One of the major causes of the current which a SRAM consumes while it is in operation is the operation current required for precharging the bit lines. In an internally synchronized SRAM which operates upon the detection of a change in the address input, its read-out operation produces a precharge pulse which will bring a pair of bit lines to an equal electrical potential (e.g., 5 V) upon the detection of the change in the address input. At this time, one of the pair of bit lines is at a high level (e.g., 5 V), while the other is at a low level (e.g., 0 V). Then, by the use of the precharge pulse, the low level bit line is charged to be at an equipotential with the high level bit line. Subsequently, a memory cell connected to a word line corresponding to a selected address is selected, so that the data in the memory cell is delivered to the bit line. An electrical potential difference is thereby produced in such a manner that the electrical potential of the bit line corresponds to the data of the memory cell. When an electrical potential difference between the bit lines rises so as to be large enough to cause a sense amplifier to normally operate, the sense amplifier is operated in such manner that one of the bit lines is set at a high level, and the other is set at a low level. The data of the memory cell selected is delivered to the input and output terminals through the sense amplifier, whereby the read operation is performed.

Since in the read cycle, one of the bit lines is precharged from 0 V to 5 V and is again brought down to 0 V, the bit line will a repeat charge—discharge operation every time that the address input undergoes a change. For this reason, this system has a problem in that the consumed current increases as the memory capacity increases. (See, IEEE Vol SC-17, No. 5, pp804–pp809, October, 1982.)

SUMMARY OF THE INVENTION

Accordingly, the present invention has as its principal object the realization of reducing the power consumption and shortening the access time of a SRAM.

This and other objects will be accomplished by a static random access memory comprising a first precharging means for precharging bit lines upon the detection of a change in an address input, a second precharging means for precharging the bit lines upon detection of the completion of a write operation, a word line driving means for controlling a period in which the word line that a column decoder has selected is selected upon the detection of a change in at least one of the address inputs—either a column address input or a row address input—and a bit line connecting means for coupling the bit lines and a sense amplifier for a certain period in synchronism with the operation of the sense amplifier, after the data in the selected memory cell has been transferred to the bit lines.

In a specific embodiment, the first precharging means is of a construction such that the pair of bit lines are rendered electrically conductive and thereby brought to be at an equipotential, utilizing the precharge pulse produced upon the detection of a change in the address input. The second precharging means is designed to be of a construction such that the bit line at a low level is precharged to around the power supply voltage in order to reduce the electrical potential difference between the bit lines which has been widened due to the write operation, utilizing the write completion pulse which has been produced upon the detection of the write operation completion. The word line driving means is designed to be of a construction adapted to drive the selected word line, using at least one of a first word line driving pulse which is produced upon detection of a change in the row address input or a second word line driving pulse which is produced upon the detection of a change in the column address input, for the period equal to the width of the first or the second word line driving pulse. Using a transfer gate for a bit line connecting means, the bit lines and the sense amplifier are composed in such manner that after the data of the selected memory cell has been transferred to the bit lines, this transfer gate is rendered conductive and after the sense amplifier has been operated, the transfer gate is brought into non-conduction.

This invention provides various advantages, among which are as follows.

(1) Since the logical amplitude of the bit line in the read-out operation is made small, the time required for precharging of the bit line may be shortened, and a cut-back on access time may be realized.

(2) Since the bit lines and the sense amplifier are not electrically connected when the data is read-out from the selected memory cell in a read-out operation, the load capacity of the bit lines may be reduced so that the data of the memory cell can be quickly read-out, and consequently, a curtailment of access time may be realized.

(3) Since the charge—discharge operation due to the precharge of the bit lines and the logical amplitude are made small, a reduced power consumption may be attainable.

While the novel features of the invention are set forth with particularity in the appended claims, the invention, both as to organization and content, will be better understood and appreciated, along with other objects and features thereof, from the following detailed description taken in conjunction with the drawings.

DETAILED DESCRIPTION OF THE INVENTION

Figure 1:
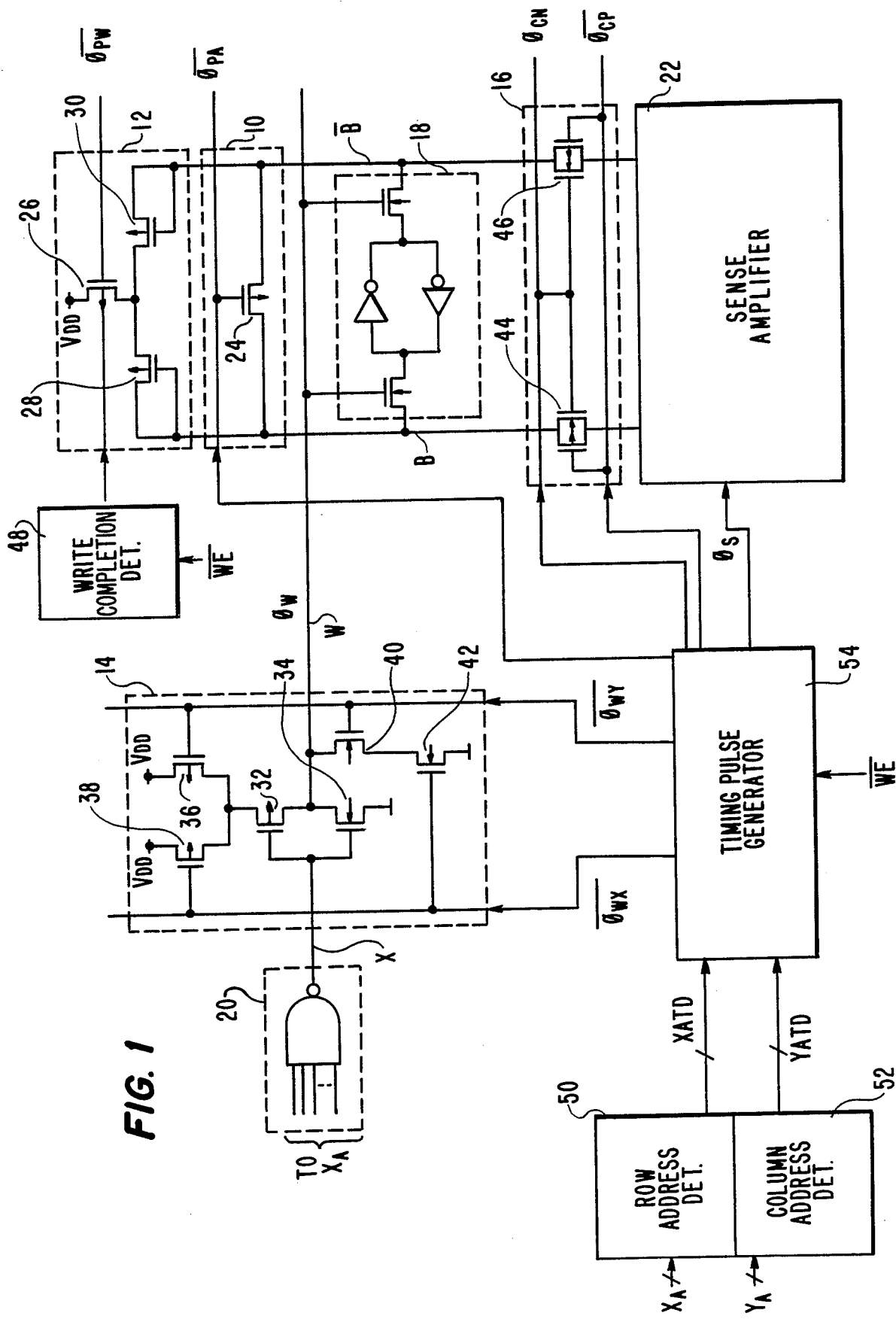
FIG. 1 is a circuit diagram of a SRAM as an embodiment of this invention.
Figure 3:
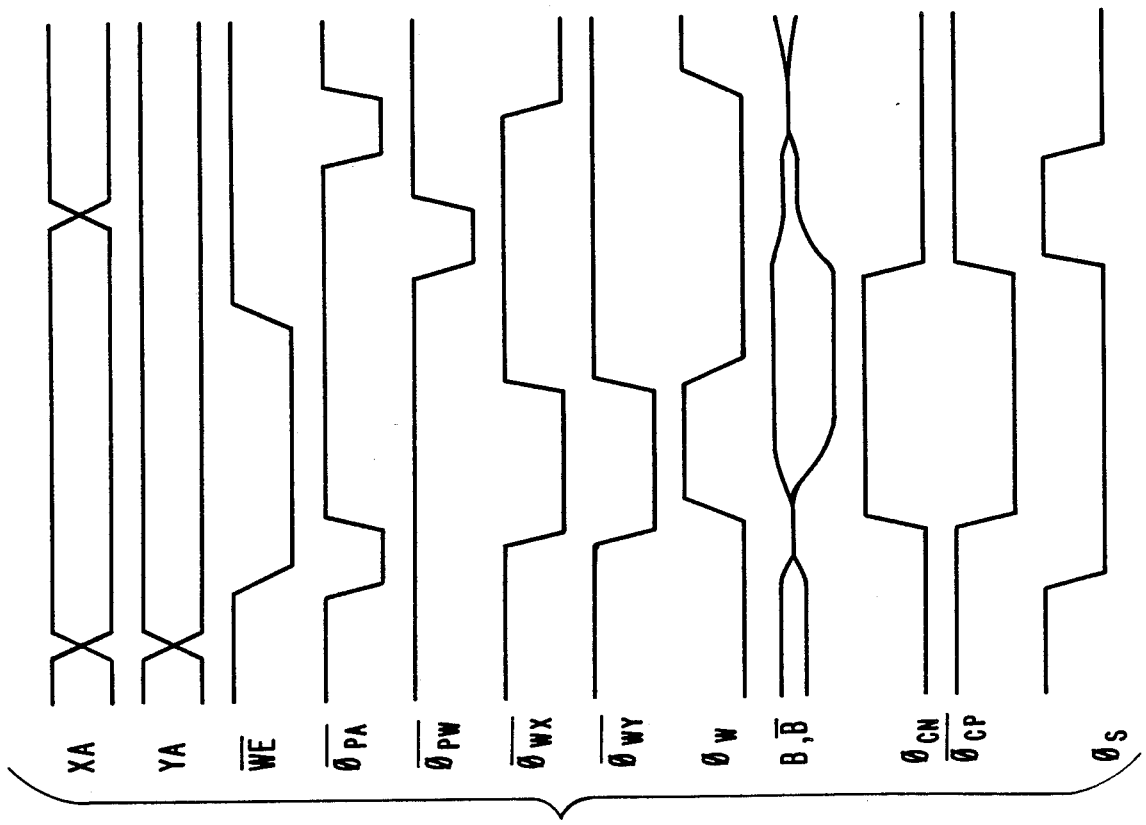
FIG. 3 shows waveforms of essential parts at of the SRAM in its write operation.
Figure 2:
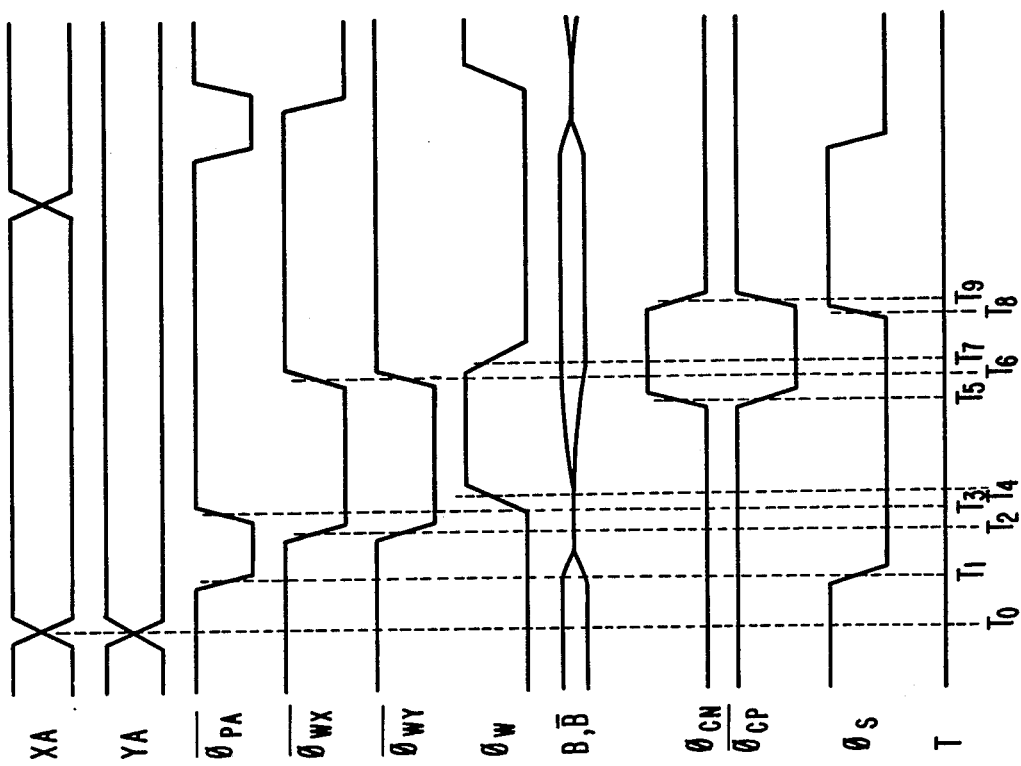
FIG. 2 shows waveforms of essential parts of the SRAM in its read-out operation.

The present invention will become more apparent from the description taken in connection with an embodiment and with reference to FIGS. 1–3.

Referring to FIG. 1, numeral 10 denotes a first precharging means; numeral 12 denotes a second precharging means; numeral 14 denotes a word line driving means; numeral 16 denotes a bit line connecting means; numeral 18 denotes a static memory cell; numeral 20 denotes a row decoder; and numeral 22 denotes a sense amplifier; numeral 48 denotes a write completion detector; numeral 50 denotes a row address detector; numeral 52 denotes a column address detector; and numeral 54 denotes a timing pulse generator.

The first precharge means 10 renders a P-channel MOSFET 24 conductive in response to a signal (precharge pulse) $\overline{\phi_{PA}}$ which is produced by a timing pulse generator which is not shown upon the detection of a change in the address input, whereby the bit lines B and $\overline{B}$ are short-circuited so as to be at an equi-potential, i.e., an equal electrical potential.

Thus, the P-channel MOSFET 24 is designed such that a precharge pulse, produced upon the detection of a change in the address input, is fed into its gate and a pair of bit lines B and $\overline{B}$ are respectively connected to its source and drain. The aforementioned precharge pulse is fed to the MOSFET 24 for a period of "L" of the precharge pulse and the pair of bit lines B and $\overline{B}$ are thus brought to an equal electrical potential.

The aforementioned P-channel MOSFET 24 may be replaced by an N-channel FET. In that case, the precharge pulse is fed to the MOSFET 24 for a period of "H".

The second precharging means 12 includes three P-channel MOSFETs 26, 28 and 30. The source of MOSFET 26 is linked to the power supply line (e.g., $V_{DD}=5$ V); the write completion pulse $\overline{\phi_{PW}}$ which is produced upon the detection of the completion of a write operation is supplied to its gate, while its drain is connected in common to the sources of the other FETs 28 and 30. The gate and the drain of FET 28 are coupled to the bit line B, while the gate and the drain of FET 30 are connected to the bit line $\overline{B}$.

The timing pulse generator which is not shown detects the leading edge of the Write Enable ($\overline{WE}$) input as the indication of the completion of the write operation produces a precharge pulse $\overline{\phi_{PW}}$ for making the electrical potential difference between the bit lines small after the write operation by rendering conductive the P-channel MOSFET 26 which receives the $\overline{\phi_{PW}}$ pulse as its gate input and is coupled to the power supply line (e.g., $V_{DD}=5$ V) at its source, for a period when $\phi_{PW}$ is low; this thereby causes the electrical potential of the bit lines B and $\overline{B}$ both to go up to around $V_{DD}$. In the unit with the P-channel MOSFETs 28 and 30 having their respective gates and drains in common, by linking the sources of FETs 28 and 30 and the drain of MOSFET 26 in common and by rendering FETs 26 and 28 or 26 and 30 conductive, the low level bit line is charged and its electrical potential is raised up to around the source voltage $V_{DD}$.

The word line driving means 14 includes 6 MOSFETs. The gates of first P-channel and N-channel MOSFETs 32 and 34 receive the output signal from the row decoder 20; the source of the first N-channel MOSFET 34 is connected to ground; the source of the first P-channel MOSFET 32 and the drains of the second and the third P-channel MOSFET 36 and 38 are connected in common; the drains of the first N-channel MOSFET 34 and the second N-channel MOSFET 40 and the word line $\phi_W$ are connected in common; the word line driving pulse $\overline{\phi_{WY}}$ produced by the timing pulse generator which is not shown upon the detection of a change in the column address input is supplied to the gates of the second P-channel and N-channel MOSFETs 36 and 40; the other word driving pulse $\overline{\phi_{WX}}$ produced by the timing pulse generator which is not shown upon the detection of a change in the row address input is supplied to the gates of the third P-channel and the third N-channel MOSFETs 38 and 42; the sources of the second and the third P-channel MOSFETs 36 and 38 are connected to the power supply line; the source of the second N-channel MOSFET 40 and the drain of the third N-channel MOSFET 42 are connected in common; and the source of the third N-channel MOSFET 42 is connected to ground.

The word line driving means 14 will, in response to a change in the address input which causes at least one of the word line driving pulse $\overline{\phi_{WX}}$ which is produced upon the detection of a change in the row address input $X_A$ and the word line driving pulse $\overline{\phi_{WY}}$ which is produced upon detection of a change in the column address input $Y_A$ and drives the word line $\phi_W$ corresponding to the row address X selected by the row decoder 20 for a certain specified period (the period when $\overline{\phi_{WX}}$ or $\overline{\phi_{WY}}$ is low), thereby bringing the memory cell 18 into the selected state.

The bit line connecting means 16 includes transfer gates 44 and 46 using a P-channel MOSFET and an N-channel MOSFET. After the memory cell which is selected by the word line driving means 14 has delivered the data into the bit lines, the bit lines B and $\overline{B}$ and the sense amplifier 22 are linked by the control signals. $\phi_{CN}$ and $\phi_{CP}$. The sense amplifier 22 starts its operation in synchronism with $\phi_{CN}$ and $\phi_{CP}$. Thereafter, by the control signals $\phi_{CN}$ and $\phi_{CP}$, the bit lines B and $\overline{B}$ are electrically separated from the sense amplifier 22. The memory cell 18 is of well-known structure and includes two inverters and two transfer gates using N-channel MOSFETs in this embodiment. The row decoder 20 delivers the row address X which is selected from the row address inputs $X_A$ supplied thereto and transfers it to the word line driving means 14. The sense amplifier 22 takes the data from the bit lines B and $\overline{B}$ in response to the control signals $\phi_{CN}$ and $\phi_{CP}$ and operates in response to the control signal $\phi_S$ to amplify and deliver the data of the memory cell corresponding to the selected address.

FIG. 2 shows waveforms at essential parts of the SRAM shown in FIG. 1 during a read-out operation. With reference to FIGS. 1 and 2, the read-out operation of the SRAM in this embodiment is described.

At the time $T_0$, the row address input $X_A$ and the column address input $Y_A$ undergo changes, and the access operation to the new address starts. At the time $T_1$, the voltage of the precharge pulse $\overline{\phi_{PA}}$ drops, thereby performing the precharge of the bit lines B and $\overline{B}$, and simultaneously therewith, the control signal $\phi_S$ of the sense amplifier 22 drops, thereby initiating the operation of the sense amplifier 22. At the time $T_2$, the first and the second word line driving pulses $\overline{\phi_{WX}}$ and $\overline{\phi_{WY}}$ drop, and the selection from among the row addresses X which have been determined before the time $T_2$ starts. At the time $T_3$, the precharge pulse $\phi_{PA}$ rises and the bit lines becomes of an equal electrical potential, thereby completing the precharge operation. The selection of the word line is begun at the time $T_2$ but, due to the delay in the rise of the electrical potential of the word line $\phi_W$, the electrical potential of the word line $\phi_W$ goes up at the time $T_4$ and, then, the selected memory cell begins to transfer the data to the bit lines. At the time $T_5$, the data of the memory cell selected is delivered into the bit lines and an electrical potential difference which is large enough to cause the sense amplifier 22 to operate will appear between the bit lines. By making use of the control signals $\overline{\phi_{CN}}$ and $\overline{\phi_{CP}}$, the bit lines and the sense amplifier 22 are electrically connected.

The reason why the bit lines and the sense amplifier 22 have been electrically separated until the time $T_5$ is to prevent the increase of the load capacity of the bit lines due to the connection of the sense amplifier.

A the time $T_6$, the first and the second word line driving pulses $\phi_{WX}$ and $\phi_{WY}$ rise and the word line is brought into an unselected state. With the delay resulting only from the delay time of the word line, the electrical potential of the word line $\phi_W$ drops at the time $T_7$, thereby rendering the memory cell unselected. This means that the data in the bit lines and those in the memory cell have now been electrically separated from each other.

At the time $T_8$, the control signal $\phi_S$ of the sense amplifier 22 rises and the sense amplifier 22 operates in response to the electrical potential difference between the bit lines B and $\overline{B}$. After the sense amplifier 22 has started its operation, the separation is made between the bit lines and the sense amplifier 22 at the time $T_9$ in response to the control signals $\phi_{CN}$ and $\overline{\phi_{CP}}$, thereby accomplishing the read-out operation.

On this ground, the logical amplitudes of the bit lines are such that the electrical potential difference is of the order only enough to induce the normal operation of the sense amplifier; thus, such a large electric potential difference as between the power supply voltage (e.g., 5 V) and 0 V which is usually required is not necessary.

FIG. 3 shows waveforms at essential parts of the SRAM shown in FIG. 1 during a write operation. The write operation of the SRAM in this embodiment is described hereunder with reference to FIGS. 1 and 3.

In the write operation, the first precharge pulse for precharing the bit lines is produced upon detection of a change in the address, thereby making the bit lines B and $\overline{B}$ equipotential. Then the word line $\phi_W$ is brought into the selected state and the transfer gate of the memory cell 18 is opened. After $\phi_W$ has become the selected state, the write data is transferred from the sense amplifier 22 through the bit line connecting means 16 to the bit lines B and $\overline{B}$, utilizing the control signals $\phi_{CN}$ and $\overline{\phi_{CP}}$, thereby rewriting the data in the memory cell. As for the procedure for producing the pulses $\phi_{CN}$ and $\overline{\phi_{CP}}$, they may be produced, using the Write Enable signal $\overline{WE}$, since $\overline{WE}$ becomes "L" in write operation. As for the control signal $\phi_S$ of the sense amplifier 22, $\phi_S$ should be kept from rising until $\overline{WE}$ becomes "H", because it is not necessary to operate the sense amplifier 22 during the write operation.

The write data which is transferred from the sense amplifier 22 to the bit lines needs to be about 5 V as the electrical potential difference between bit lines. The electrical potential difference between the bit lines in the read-out operation should be of the order simply enough to permit the operation of the sense amplifier 22, but the electrical potential difference between the bit lines in the write operation becomes about 5 V. On this ground, there is provided a second precharging means 12 which, once the completion of write operation is detected, assuming it to be indicated by detecting the rise of $\overline{WE}$, a second precharge pulse $\overline{\phi_{PW}}$ for the bit line is produced and with this pulse $\overline{\phi_{PW}}$, the bit line having a potential on the 0 V side is precharged beforehand to around 5 V by the second precharging means 12 due to the pulse $\overline{\phi_{pw}}$.

In this way, a relatively small width is permissible for the first precharge pulse $\phi_{PA}$ which is produced upon detection of a change in the address, enabling a curtailment of the access time, as compared with that of a conventional device. On the other hand, the fluctuation of the electrical potential on the bit lines in the write operation is from 0 V to 5 V, but in the readout operation, an electrical potential difference only needs to be of the order enough to permit the operation of the sense amplifier, and therefore power consumption may be reduced, as compared with the conventional device in which the electric potential fluctuates from 0 V to 5 V every time that the address changes, and the diminished logical amplitude in the read-out operation allows a high speed access time.

As hereabove described, according to this invention, since the logical amplitudes of the bit lines are made small in the read-out operation, the time required for precharging the bit lines may be reduced. Besides, the load capacities of the bit lines are made small since the bit lines and the sense amplifier are electrically separated when the data of the selected memory cell is read-out, thereby enabling the data of the memory cell to be quickly read-out. In that way, a cut-back on access time is effected. The charge-discharge operation conducted by a precharge of bit lines is diminished through the reduction of the logical amplitudes, whereby curtailment of the power consumption is effected.

It goes without saying that equivalent effects may be achieved by substituting the first and the second precharging means, the word line driving means and the bit line connecting means with other circuits which perform similar operations as those hereabove mentioned.

While specific embodiments of the invention have been illustrated and described herein, it is realized that modifications and changes will occur to those skilled in the art. It is therefore to be understood that the appended claims are intended to cover all modifications and changes as fall within the true spirit and scope of the invention.

What we claim is:

1. A static random access memory comprising:
    a first precharging means for precharging bit lines in response to a first input signal supplied thereto which occurs upon a detection of a change in an address input;
    a second precharging means for precharging the bit lines in response to a second input signal supplied thereto which occurs upon a detection of the completion of a write operation,
    a word line driving means for controlling a period in which a word line selected by a row decoder is selected in response to third and fourth input signals supplied thereto which respectively occur upon a detection of a change in at least one of a row address input and column address input; and
    a bit line connecting means for coupling the bit lines and a sense amplifier for a specified period in synchronism with the operation of the sense amplifier, after the data of the memory cell selected in a read-out operation has been transferred to said bit lines.

2. A static random access memory as recited in claim 1, wherein said first precharging means comprises a P-channel MOSFET which receives said first input signal as its gate input and has its source and drain respectively connected to said bit lines, said P-channel MOSFET being rendered conductive during a period "L" of a precharge pulse of said first input signal, thereby making the bit lines equi-potential.

3. A static random access memory as recited in claim 1, wherein said first precharging means comprises an N-channel MOSFET which receives said first input signal as its gate input and has its source and drain respectively connected to said bit lines, said N-channel MOSFET being rendered conductive for a period "H" of a precharge pulse of said first input signal, thereby making the bit lines equi-potential.

4. A static random access memory as recited in claim 1, wherein said word line driving means comprises means such that, by at least one of a first word line driving pulse of said third input signal which is produced upon detection of a change in a row address input and a second word line driving pulse of said fourth input signal which is produced upon detection of a change in a column address input, a word line selected by said row decoder is driven for a period equal to the width of said first or second word line driving pulse.

5. A static random access memory as recited in claim 1, wherein said bit line connecting means includes a transfer gate which comprises a P-channel MOSFET and an N-channel MOSFET, and by using said bit line connecting means, such bit lines and sense amplifier are electrically connected together after the data in the memory cell selected is transferred to the bit lines in read-out operation and the bit lines and sense amplifier are electrically disconnected after said sense amplifier has been brought into operation.

6. A static random access memory as recited in claim 1, wherein said second precharging means comprises: a first P-channel MOSFET having a source which is connected to a power supply line and a write completion pulse of said second input signal, which is produced upon detection of the completion of the write operation, is supplied to its gate and its drain is coupled in common with sources of second and third P-channel MOSFETs; a gate and a drain of said second P-channel MOSFET are connected to one of said bit lines, and a gate and a drain of said third P-channel MOSFET are connected to another of said bit lines.

7. A static random access memory as recited in claim 1, wherein said second precharging means comprises a MOSFET which receives said second input signal as its gate input for diminishing, by use of a write completion pulse of said second input signal, the electrical potential difference between said bit lines which has been widened due to a write operation.

8. A static random access memory as recited in claim 1, wherein said word driving means comprises: first P-channel and N-channel MOSFETs having gates for receiving an output signal from said row decoder; a source of said first N-channel MOSFET is coupled to ground; a source of said first P-channel MOSFET and drains of said and third P-channel MOSFETs are coupled in common; drains of said first P-channel and N-channel MOSFETs and said second N-channel MOSFET and said word line are connected in common; on gates of said second P-channel and N-channel MOSFETs, a first word line driving pulse which is produced upon a detection of a change in a row address input is supplied; on gates of said third P-channel and N-channel MOSFETs, a second word line driving pulse which is produced upon a detection of a change in the column address input is supplied; sources of said second and third P-channel MOSFETs are connected to said power supply line; a source of said second N-channel MOSFET and a drain of said third N-channel MOSFET are coupled in common and a source of said third N-channel MOSFET is coupled to ground.

9. A static random access memory comprising a first precharging means for precharging bit lines upon a detection of a change in address and a second precharging means for precharging the bit lines upon a detection of completion of write operation;
said first precharging means having an MOSFET in which a precharge pulse produced upon a detection of a change in address is supplied to its gate and a pair of bit lines are connected to its source and drain, said MOSFET being rendered conductive only during a specified period of said precharge pulse, thereby making the pair of bit lines equi-potential, and
said second precharging means having a MOSFET for receiving, as its gate input, a write completion pulse which is produced upon a detection of completion of write operation, in order to diminish, by the use of said write completion pulse, an electrical potential difference between said bit lines which is increased due to a write operation.

10. A static random access memory as recited in claim 9, wherein, when said MOSFET is of a P-channel type, said specified period of said precharge pulse is a period of "L" of said pulse and when said MOSFET is of an N-channel type, said specified period is that of "H".

11. A static random access memory as recited in claim 9, wherein said second precharging means comprises a first P-channel MOSFET having a source connected to a power supply line; a write completion pulse which is produced upon a detection of the completion of the write operation being supplied to its gate; its drain is coupled in common with sources of second and third P-channel MOSFETs; a gate and a drain of said second P-channel MOSFET are connected to one of said bit lines, and a gate and a drain of said third P-channel MOSFET are connected to another of said bit lines.

12. A static random access memory comprising:
bit lines;
a sense amplifier;
a row decoder;
a word line driving means for controlling a period in which a word line selected by said row decoder is selected upon a detection of a change in at least one of row address input and a column address input; and
a bit line connecting means for connecting said bit lines and a sense amplifier for a specified period in synchronism with the operation of said sense amplifier, after the data of the memory cell selected in read-out operation is transferred to the bit lines;
wherein said word driving means comprises first P-channel and N-channel MOSFETs having gates for receiving an output signal from said row decoder; a source of said first N-channel MOSFET is coupled to ground; second and third P-channel and N-channel MOSFETs; a source of said first P-channel MOSFET and drains of said second and third P-channel MOSFETs are coupled in common; drains of said first P-channel and N-channel MOSFETs and said second N-channel MOSFET and said word line are connected in common; on gates of said second P-channel and N-channel MOSFETs, a first word line driving pulse which is produced upon a detection of a change in a row address input is supplied; on gates of said third P-channel and N-channel MOSFETs, a second word line driving pulse which has been produced upon a detection of a change in a column address input is supplied; sources of said second and third P-channel MOSFETs are connected to said power supply line; a source of said second N-channel MOSFET and a drain of said third N-channel MOSFET are coupled in common; and a source of said third N-channel MOSFET is coupled to ground.

* * * * *